United States Patent
Hauck

(10) Patent No.: US 6,594,816 B1
(45) Date of Patent: Jul. 15, 2003

(54) METHOD AND AN APPARATUS FOR SYNTHESIZING A PROGRAMMABLE LOGIC CIRCUIT

(75) Inventor: Lane Hauck, San Diego, CA (US)

(73) Assignee: Cypress Semiconductor Corporation, San Jose, CA (US)

(*) Notice: Subject to any disclaimer, the term of this patent is extended or adjusted under 35 U.S.C. 154(b) by 0 days.

(21) Appl. No.: 09/875,708

(22) Filed: Jun. 5, 2001

(51) Int. Cl.⁷ .............................................. G06F 17/50
(52) U.S. Cl. ................... 716/18; 716/1; 716/2; 716/4
(58) Field of Search ............................ 716/1, 2, 4, 18; 329/73; 371/15, 22.3

(56) References Cited

U.S. PATENT DOCUMENTS

| | | | |
|---|---|---|---|
| 4,602,210 A | * | 7/1986 | Fasang et al. ............ 714/731 |
| 5,260,948 A | * | 11/1993 | Simpson et al. ........... 714/727 |
| 5,602,855 A | * | 2/1997 | Whetsel, Jr. .............. 714/727 |
| 6,363,520 B1 | * | 3/2002 | Boubezari et al. ........... 716/18 |
| 2002/0100001 A1 | * | 7/2002 | Lai et al. ..................... 716/1 |

* cited by examiner

Primary Examiner—David Nelms
Assistant Examiner—Dao H. Nguyen
(74) Attorney, Agent, or Firm—Wagner, Murabito & Hao LLP

(57) ABSTRACT

A method for describing a user programmable logic function generator in a Hardware Description Language (HDL), e.g., Verilog is disclosed. The logic function generator includes a multiplexer having a plurality of select inputs and a plurality of programmable data inputs. The logic function generator which can be implemented exclusively with gates generates a function of the select inputs. The logic function generator receives user's input through the plurality of data inputs to generate an output of a desired logic function of the select inputs. The logic function generator is entirely made of standard gates, which is amenable to representation by and inclusion in standard design libraries. The invention further provides a user with greater flexibility by allowing a cascading of a number of logic function generators for generating multi-variable functions generated of a greater number of select inputs.

27 Claims, 10 Drawing Sheets

190

| dcba | Y |
|------|---|
| ---- | - |
| 0000 | 0 | ← 1'
| 0001 | 1 | ← 2'
| 0010 | 1 |
| 0011 | 0 |
| 0100 | 1 |
| 0101 | 0 |
| 0110 | 0 |
| 0111 | 1 |
| 1000 | 1 |
| 1001 | 0 |
| 1010 | 0 |
| 1011 | 1 |
| 1100 | 0 |
| 1101 | 1 |
| 1110 | 1 |
| 1111 | 0 | ← 16'

FIGURE 1B

```
1  module funcblock(ck,res,cf,mt,sel,y) ;
2  input ck,res;
3  input [2:0]cf;              // config bits
4  input [0:15]mt;             // minterm selector bits
5  input [3:0]sel;             // four logic inputs
6  output  y;                  //function block output 7  wire    mux_out = mt[sel];  //the function generator mux 8  reg dqp, tqp, dqn, tqn;     //D and T flip-flops (p=pos, n=neg edge)
9  always @(posedge ck)        //pos edge ff's
10    begin
11       dqp <= !res & mux_out;       //define D-ff (mux_out is D)
12       tqp <= !res & (tqp^mux_out); //define T-ff (mux_out is Enable)
13    end
14 always @(negedge ck)        //neg edge ff's
15    begin
16       dqn <= !res & mux_out;       //define D, T again for neg-edge clock
17       tqn <= !res & (tqn^mux_out);
18    end
19 reg out;
20 always @(cf or dqp or tqp or dqn or tqn or mux_out)
21    case (cf)
22    3'd0:     out = dqp;     //0-3: flip-flops
23    3'd1:     out = tqp;
24    3'd2:     out = dqn;
25    3'd3:     out = tqn;
26    default:  out = mux_out; //4-7: direct from function gen mux
27    endcase
28 assign y = out;
29 endmodule
```

FIGURE 5B

```
100  module P8R4SCAN(Clock, RESET, A, B, C, D, E, F, G, H, YQ, SCANIN, SCANOUT, SCANCK);
101  input[ 1:0] CLOCK;
102  input RESET, A, B, C, D, E, F, G, H, SCANIN, SCANCK;
103  output[ 0:3} YQ;
104  output SCANOUT;

105  // A 78-bit shift register to shift in the 64 minterm & 14 config bits
106  reg[ 0:77] K;
107  integer j;
108  always @(posedge SCANCK)
109     begin
110        K[ 0] <= SCANIN;
111        for ( j=1;j<78;j=j+1)          //shifts from K[ 0]→ K[ 77]
112           K[j] <=K[ j-1];
113     end
114  assign SCANOUT = K[ 77];

115  wire emux1 = (K[ 76] ) ? YQ[ 0] : E;   //the two E-cascade mux's
116  wire emux1 = (K[ 77] ) ? YQ[ 2] : E;

117  funcblock fb1(  .ck    (CLOCK[ 0] ),     //f1
118                  .res   (RES) ,
119                  .cf    (K[ 64:66] ) ,
120                  .mt    (K[ 0:15] ) ,
121                  .sel   (( A, B, C, D) ),
122                  .y     (YQ[ 0] ) ) ;

123  funcblock fb2(  .ck    (CLOCK[0] ),      //f2
124                  .res   (RES) ,
125                  .cf    (K[ 67:69] ) ,
126                  .mt    (K[ 16:31] ) ,
127                  .sel   (( emux, F,G,H) ),
128                  .y     (YQ[ 1] ) ) ;
```

FIGURE 6

```
129  funcblock fb3(  .ck    (CLOCK[ 1] ),    //f3
130                  .res   (RES) ,
131                  .cf    (K[ 70:72] ) ,
132                  .mt    (K[ 32:47] ) ,
133                  .sel   (( A, B, C, D) ),
134                  .y     (YQ[ 2] ) ) ;

135  funcblock fb4(  .ck    (CLOCK[ 1] ),    //f4
136                  .res   (RES) ,
137                  .cf    (K[ 73:75] ) ,
138                  .mt    (K[ 48:63] ) ,
139                  .sel   (( emux2, F, G, H) ),
140                  .y     (YQ[ 3] ) ) ;
141  endmodule
```

```
┌─────────────────────────────────────────────┐
│ ACCESS AN HDL DESCRIPTION OF A PROGRAMMABLE │
│  CIRCUIT, WHERE THE PROGRAMMABLE CIRCUIT    │
│  INCLUDES A GATE-ONLY PROGRAMMABLE BLOCK    │
│                    710                      │
└─────────────────────────────────────────────┘
                      │
                      ▼
┌─────────────────────────────────────────────┐
│  SYNTHESIZE THE GATE-ONLY PROGRAMMABLE BLOCK│
│           INTO A STANDARD LIBRARY           │
│                    720                      │
└─────────────────────────────────────────────┘
                      │
                      ▼
┌─────────────────────────────────────────────┐
│  INTEGRATE THE STANDARD LIBRARY CELL INTO AN│
│           INTEGRATED CIRCUIT DESIGN         │
│                    730                      │
└─────────────────────────────────────────────┘
```

FIGURE 7

METHOD AND AN APPARATUS FOR SYNTHESIZING A PROGRAMMABLE LOGIC CIRCUIT

FIELD OF INVENTION

The present invention relates to the field of integrated circuit technology. More specifically an embodiment of the present invention relates to a synthesizable programmable logic architecture.

BACKGROUND OF THE INVENTION

A relatively short life span of any particular integrated circuit design and competitive nature of electronic industry requires a short "time to market" period. Furthermore, the ever increasing complexity of integrated circuit (IC) devices mandates a departure from traditional time consuming "paper-and-pencil" method of design to a more efficient method of "describe-and-synthesize" approach. Hardware Description Languages (HDLs) and computer aided design systems have been used throughout the industry to facilitate the design of integrated circuits and to shorten the time period in the design phase of the integrated circuit devices. Aided by HDLs, a designer describes the behavior or the structure of a digital circuit in HDL and a CAD system, in return, synthesizes the behavior and provides the designer with a schematic of the desired circuit in, a shortened period of time.

Ideally the consumer of ICs would prefer to have a general purpose chip such as a Universal Serial Bus (USB) controller to provide the ability to connect to many diverse interfaces such as disk drive, wireless systems, and modems. A response to such demand can take either of the two solutions: a) providing multiple pre-built logic blocks and allowing the designer to select between the logic blocks or b) providing a general purpose state machine-based logic block such as General programmable Interface (GPIF).

It is very difficult, even with highly programmable units such as GPIF, to anticipate all logic configurations required by future designs that utilize the general-purpose chip. Therefore a small amount of customization by the user is often required to convert and tailor interface signals between chips.

A well-known solution for implementing user customizable logic is the use of a programmable logic chip, e.g., a Complex Programmable Logic Device (CPLD) or Field Programmable Gate Array (FPGA) architecture. Incorporating a small programmable logic block onto a general-purpose chip such as USB controller would be a highly advantageous method for providing the user with the logic programming required for customization. However, CPLD technology is not, generally amenable to synthesis using standard logic design flows or incorporation into standard libraries, which can be employed by various chip geometries and technologies. Because conventional CPLDs are built using highly customized layouts and are fine-tuned to specific geometries and technologies, they are not suitable for synthesis in various standard digital technologies.

Devices such as FPGAs or CPLDs are gaining popularity in use, but components used in the design of these devices are not amenable to standard design libraries (e.g., memories, fuses, interconnects or routing matrices). To further improve the process of synthesizing a user programmable digital device, designers need tools to describe a complex electronic circuit and those devices, which are not amenable to a standard library, in a programmable logic language.

SUMMARY OF THE INVENTION

Therefore, a need exists to provide IC designers with tools to synthesize a complex programmable block using standard cell libraries. Another need exists to list all components used to design an electronic device in a standard design library using components, which are describable in HDL. Another need exists to build programmable logic blocks, which are synthesizable and do not use fuses, standard interconnect or routing matrices which are not amenable to a design library. Another need exists to design electronic devices, which are fast and consume less power.

The present invention provides a novel solution to these requirements.

Accordingly, an embodiment of the present invention provides IC designers with tools to synthesize a complex programmable logic device from a standard cell library. Another embodiment of the present invention provides substitutes for components which are not amenable to standard design libraries (e.g., memories, fuses, routing matrices and standard interconnects) with components which are describable in HDL and amenable to standard design libraries,. Embodiments of the present invention provide programmable logic blocks, which are synthesizable and do not use fuses, RAM look up tables, standard interconnect or routing matrices which are not amenable to a standards design library. One embodiment of the present invention constructs modules entirely from standard gates, which are synthesizable, fast and consume less power. The described architecture is easy to scale because the basic programmable logic block may be duplicated as many times as required.

A method for describing a user programmable logic function generator in Verilog language is disclosed. The logic function generator includes a multiplexer having a plurality of select inputs and a plurality of data inputs, which are preloaded bits. The logic function generator generates a function of the select inputs. The logic function generator receives user's input through the plurality of data inputs to generate an output of a desired logic function of the select inputs. The logic function generator is entirely made of standard gates, which is amenable to representation by design libraries. In one embodiment, flip-flops or non-volatile cells may be used as the preloaded bits. The invention further provides a user with greater flexibility by allowing a cascading of a number of logic function generators for generating multi-variable functions generated of a greater number of select inputs.

The Verilog description can be used to generate a standard cell library, which can then be integrated into other IC designs as needed to provide a programmable logic device. Integration into well-known IC technologies is possible because the standard cell library is gates only.

More specifically, embodiments of the present invention include a memory stored Verilog description of a circuit, comprising a programmable circuit for storing a function. The programmable circuit includes a first multiplexer including: a plurality of select inputs; a plurality of first data inputs; and an output. The first multiplexer includes a plurality of programmable bits coupled to each one of the plurality of first data inputs for implementing a logic function of the select inputs. The programmable circuit further includes a plurality of latches coupled to the output of the first multiplexer, a second multiplexer including a plurality of inputs including the output of the first multiplexer and a plurality of second data inputs. The second multiplexer is logically coupled to the first multiplexer and has an output. There are a plurality of programmable bits coupled to each one of the plurality of second data inputs for receiving the output of the first multiplexer.

BRIEF DESCRIPTION OF THE DRAWINGS

The accompanying drawings, which are incorporated in and form a part of this specification, illustrate embodiment of the invention and, together with the description, serve to explain the principles of the invention:

FIG. 1B is an illustration of a truth table example for four variables for the circuit of FIG. 1A.

FIG. 5B represents Verilog code for implementing the logic shown in FIG. 5A.

FIG. 6 is a Verilog description of a programmable logic function generator illustrated in FIG. 4, in accordance with an embodiment of the present invention.

FIG. 7 is a flowchart of steps of process 700 for inserting an HDL description of a standard device into an HDL description of a larger integrated circuit.

DETAILED DESCRIPTION OF THE PREFERRED EMBODIMENTS

Reference will now be made in detail to preferred embodiment of the invention, synthesizable programmable logic, examples of which are illustrated in the accompanying drawings. While the invention will be described in conjunction with the preferred embodiments, it will be understood that they are not intended to limit the invention to these embodiments. On the contrary, the invention is intended to cover alternatives, modifications, and equivalents, which may be included within the spirit and scope of the invention as defined by the appended claims. Furthermore, in the following detailed description of the present invention, numerous specified details are set forth in order to provide a thorough understanding of the present invention. However, it will be obvious to one Of ordinary skill in the art that the present invention may be practiced without these specific details. In other instances, well-known methods, and circuits have not been described in detail as not to unnecessarily obscure aspects of the present invention.

Figure 1A:
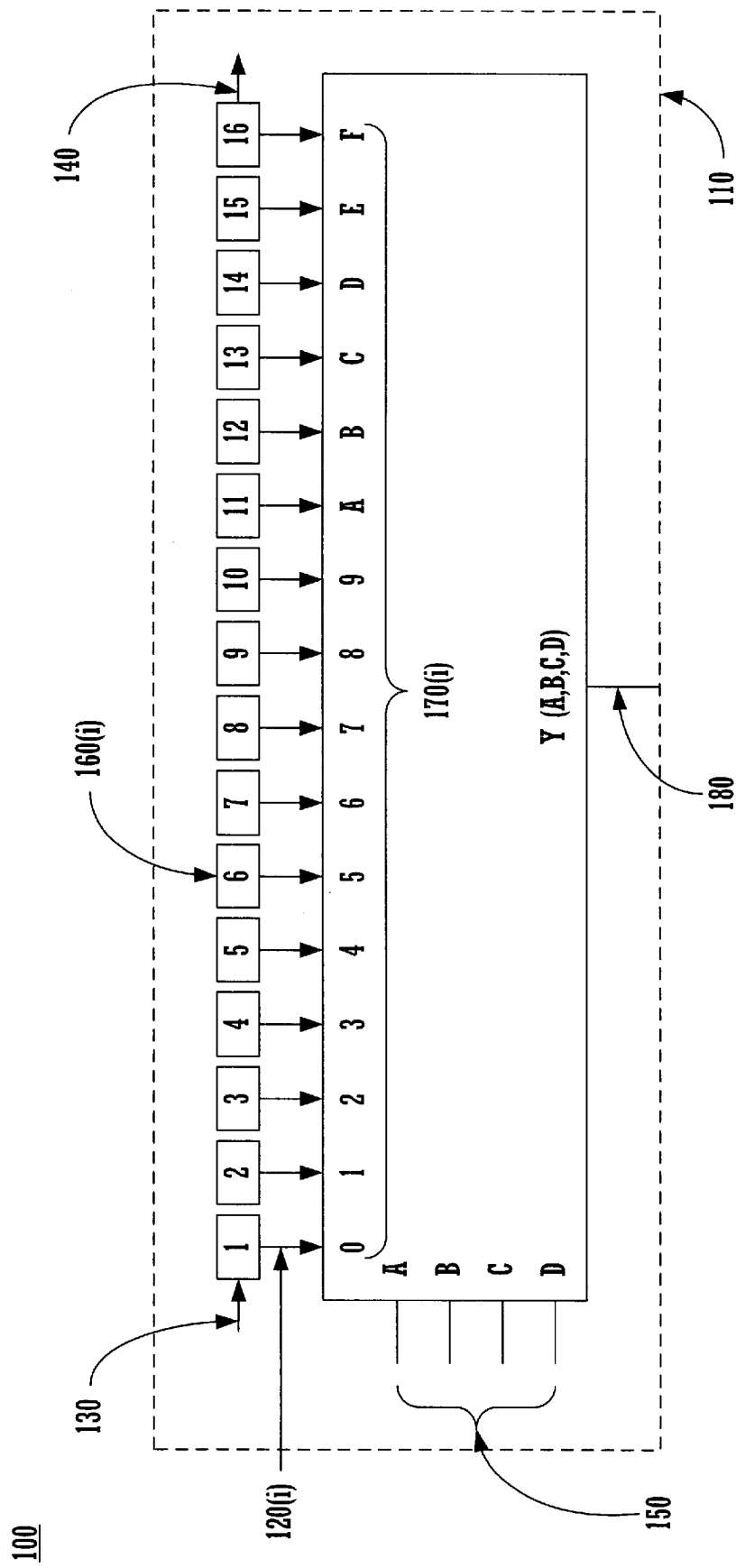
FIG. 1A is a block diagram of a programmable logic device having a programmable function generator, in accordance with the present invention, with four select inputs and 16 data inputs.

FIG. 1A depicts a 16-1 multiplexer 110 used as a basic programmable function generator by the present invention. Multiplexer 110 has four select inputs 150, and 16 preloaded inputs 120($i$), (shown as 0-F). Multiplexer 110 can generate an output Y(A,B,C,D), which is any arbitrary function of four select inputs 150 (i.e., A,B,C,D). Multiplexer 110 can be customized to generate combinatorial functions of select variable (i.e., A,B,C,D) of inputs 150. Customization of multiplexer 110 can be achieved through programming data inputs 120($i$). Data inputs 120($i$) may be loaded into latches 160($i$) coupled to inputs 170($i$) of multiplexer 110. Programmable latches 160($i$) can be either volatile flip-flops or non-volatile storage cells. Latches 160($i$), in this embodiment of the present invention, function as a shift registers.

In one embodiment of this invention, data inputs 120($i$) are loaded into latches 160($i$) at scan input 130 with a bit stream of data to set all latches 160($i$). The output 140 allows the shift register to be concatenated with another instantiation of multiplexer 110 or other configuration data, which may be cascaded with multiplexer 110. Although, in this embodiment of the present invention, shift register 160($i$) is used to load data inputs 120($i$) into multiplexer 110, other embodiment of this invention may use any storage element capable of holding a binary value (e.g., nonvolatile memory cells) to load data input and to present the logic state of the selected input at the output terminal 180. Furthermore, any size multiplexer can be used as a function generator. Generalizing, a multiplexer with n select inputs will require a programmable data input of $2^n$ bits.

Multiplexer 110, used as a function generator is a programmable device and can be customized for a particular use by a user. Programmable logic can be generated using a multiplexer, thus these logic generators can be synthesized entirely from standard logic gates without any need of RAM look up tables or programmable fuses.

For example, any logic function of four select inputs 150 (i.e., A,B,C,D) can be realized by pre-programming inputs 170($i$) of multiplexer 110. The first input 170(0) corresponds to the logic term !D&!C&!B&!A (where ! denotes NOT and & denotes AND), the second term 170(1) corresponds to !D&!C&!B&A, the third term 170(2) corresponding to !D&!C& B&!A, and so on up to the last input 170(F) corresponding to A&B&C&D. In this manner all possible combinations of four select inputs 150 (i.e., A,B,C,D) can be selected by the {A,B,C,D} select multiplexer signals 150. A valid combination of variables, or minterms, is programmed with a '1', so that when the minterm is selected by the { ABCD} select inputs, it causes the output. 180 of multiplexer 110 to go high. Likewise, a minterm that does not appear in the desired logic equation is programmed with a '0'.

FIG. 1B illustrates a table 190 of 16 values for A,B,C,D. The function generated implements a parity generator having the equation:

Y=A xor B xor C xor D

The xor is the 'exclusive OR' logic function.

To achieve this example logic function, the 16 different values under table output Y are loaded into the shift register 160($i$) scan input 130. For example, the value 1' is loaded into multiplexer cell 160(1) of shift register 160($i$), the value 2' is loaded into multiplexer cell 160(2) of shift register 160($i$), and so on until the value 16' is loaded into multiplexer cell 160(16) of shift register 160($i$). Cells 1–16 of shift register 160($i$) are loaded with binary bits under column Y of table in FIG. 1B. Then, due to multiplexer selecting action, the sixteen combinations of (A,B,C,D) shown in FIG. 1B will produce output Y(A,B,C,D) shown in the FIG. 1B table. It will be recognized by those skilled in the art that this function Y(A,B,C,D)is a parity generator, with the output equal one only when the four inputs contain an odd number of '1' bits.

Since the inputs 120($i$) to an IC using this architecture are programmed by the user of the IC, and is not synthesized as a fixed function, function generator 110 implements a user programmable logic function generator. According to the present invention, this programmable logic function is built entirely from standard logic gates, which may be synthesized using standard process and technologies. It is appreciated that this architecture is in contrast to specialized technologies such as RAM blocks, fuses, and interconnect matrices that are used in standard programmable logic chips such as CPLD and FPGA.

Figure 2:
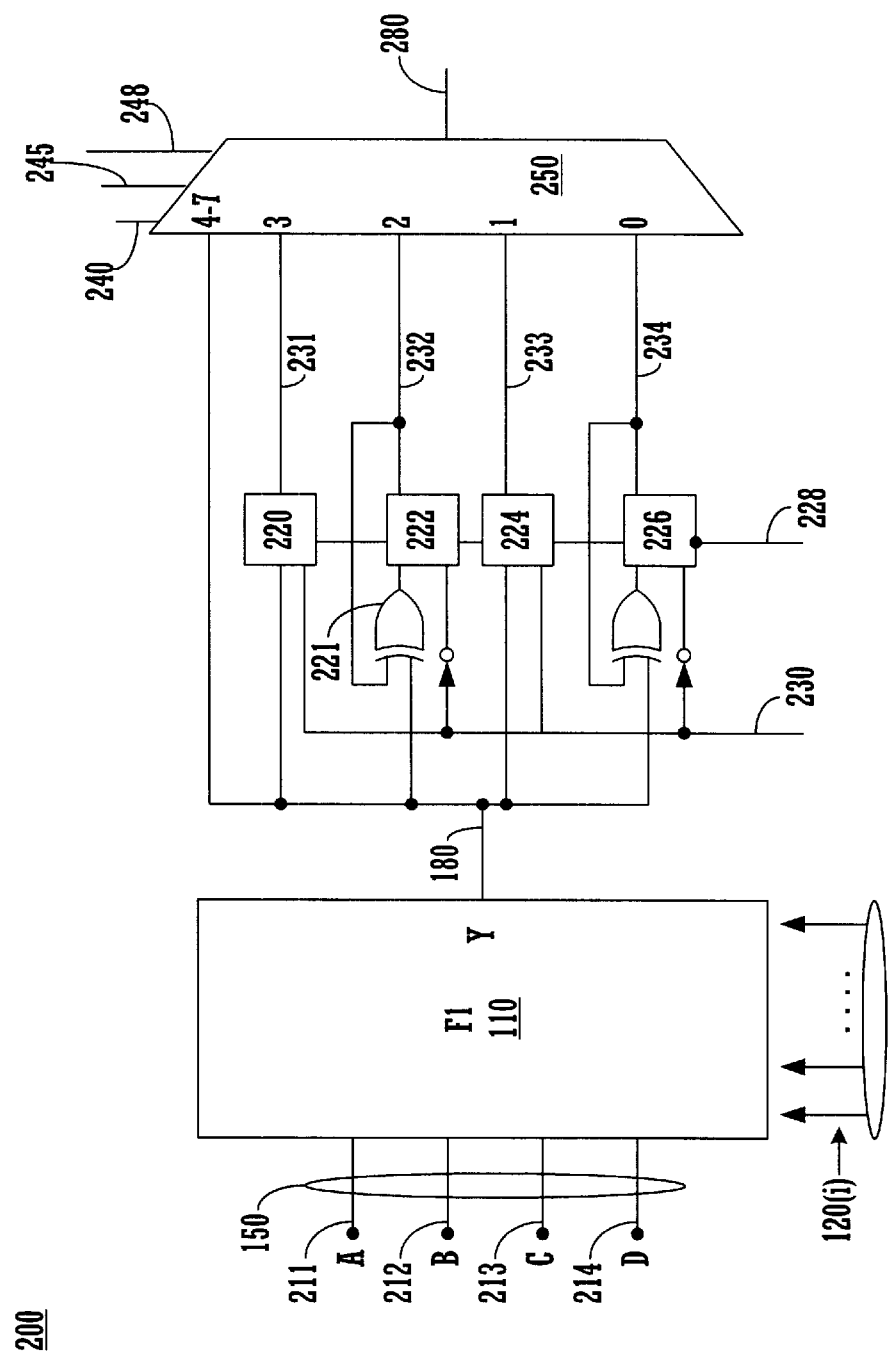
FIG. 2 is an exemplary synthesizable microcell with combinatorial logic function of four select inputs represented at output Y of FIG. 4, in accordance with an embodiment of the present invention.

FIG. 2 illustrates an exemplary circuit to be represented in a Verilog description language by present invention. Multiplexer 110 can be programmed to generate a desired logic function and represent that function as its output 180. Output 180, which is a combinatorial function of (A,B,C,&D), is received by latches 220, 222, 224, and 226. Latches 220, 222, 224, and 226 are clocked by clock signal 230 and reset by reset 228. Latch 220 is a positive-edge triggered D flip-flop, Latch 222 is a positive-edge triggered T flip-flop, Latch 224 is a negative-edge triggered D flip-flop and Latch 226 is a negative-edge triggered T flip-flop.

A second Multiplexer 250 receives the outputs of the latches 220, 222, 224, 226, and the unlatched function generator output 180, and presents one of these inputs at its output terminal 250, in accordance with the setting of three selector bits 240, 245, and 248. Selector input bits 240, 245, and 248 are labeled as "cf0, cf1, cf2" (configuration bit), respectively, in the Verilog description of the circuit in FIG. 5B and FIG. 6. Selector input bits are user programmable and a user can program selector input bits to determine which output among the output of latches 220, 222, 224, 226 and function generator 180 will appear as output 280. These selector bits are pre-programmed by a user of the chip using invention in the same manner as the minterm bits 120(i) of multiplexer 110. In one embodiment of the present invention the configuration bits 240, 245, 248 are loaded along with data inputs 120(i) of multiplexer 110 by extending the shift register of 160(i) to incorporate all user programmable bits (e.g., minterm bits and configuration bits).

Figure 3:
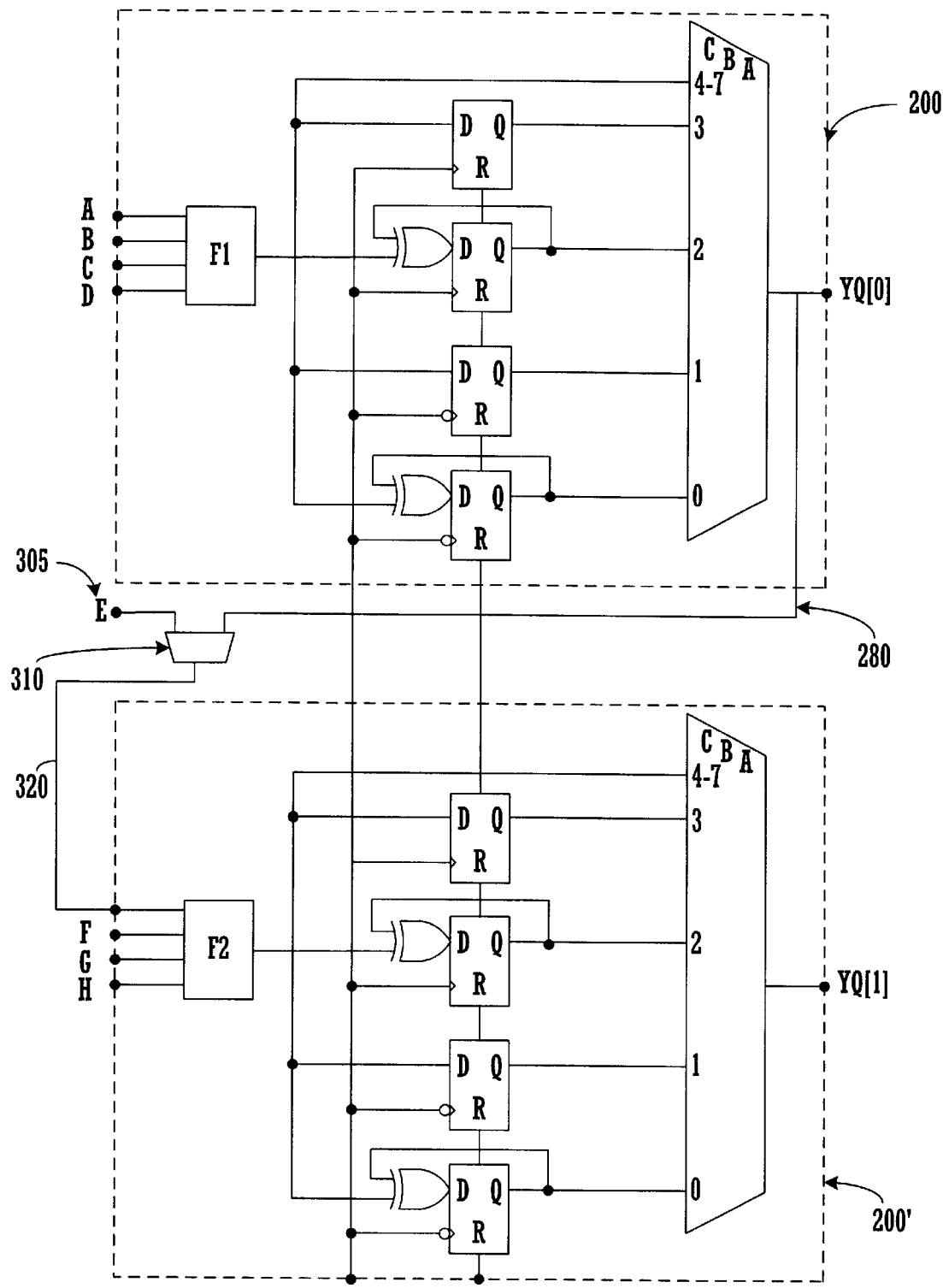
FIG. 3 is an illustration of cascading two synthesizable microcells of FIG. 2 having 8 select inputs and two outputs, in accordance with an embodiment of the present invention.

FIG. 3 illustrates a larger logic block 300, cascading two logic blocks 200 of FIG. 2 in order to construct an eight input two output logic block. To construct an eight-input logic block 300, a two to one multiplexer 310 is used to couple two logic blocks 200. Input 320 to the second logic bloc 200' is either an input 305 to second logic block 200' or the output 280 of the fist logic block.

Figure 4:
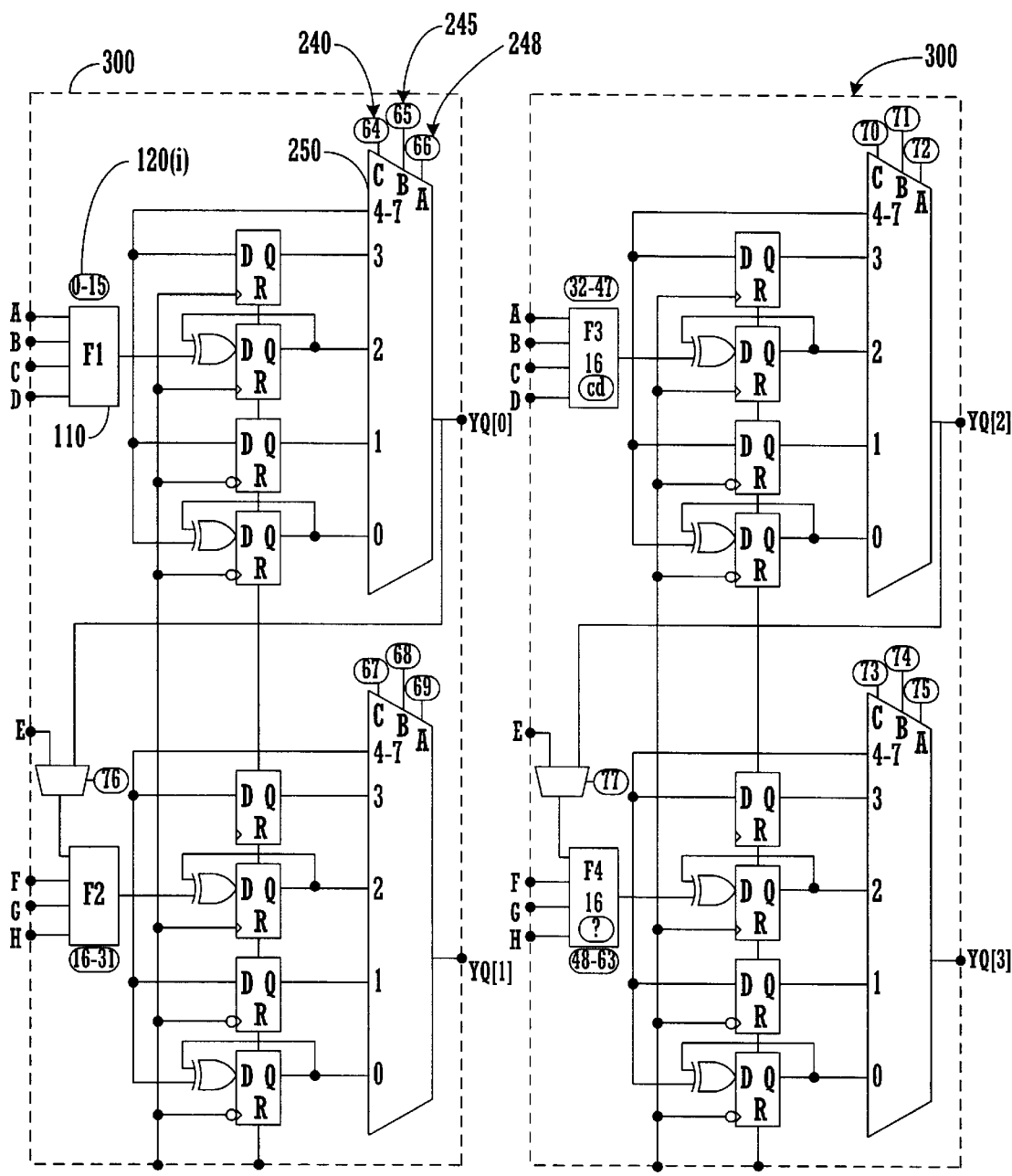
FIG. 4 illustrates a further embodiment cascading Microcells of FIG. 1 yielding a logic function generator with 8 select data and 4 outputs, in accordance with an embodiment of the present invention.

FIG. 4 illustrate further cascading of logic block 200. In one embodiment of the present invention, to expand the number of logic functions and thus increase the capability of the logic function generator, logic blocks 200 are further cascaded to form a function generator 400 having 8 select input and four outputs. Device 400 has total of 78 configuration data input bits to customize four microcells 100, the building-block of device 400. Multiplexer 110 has 16 configuration data inputs 120(i) (shown as mt[0:15] in FIG. 5A and in Verilog description of FIG. 5B) and multiplexer 250 has three data inputs (240, 245, and 248).

Figure 5A:
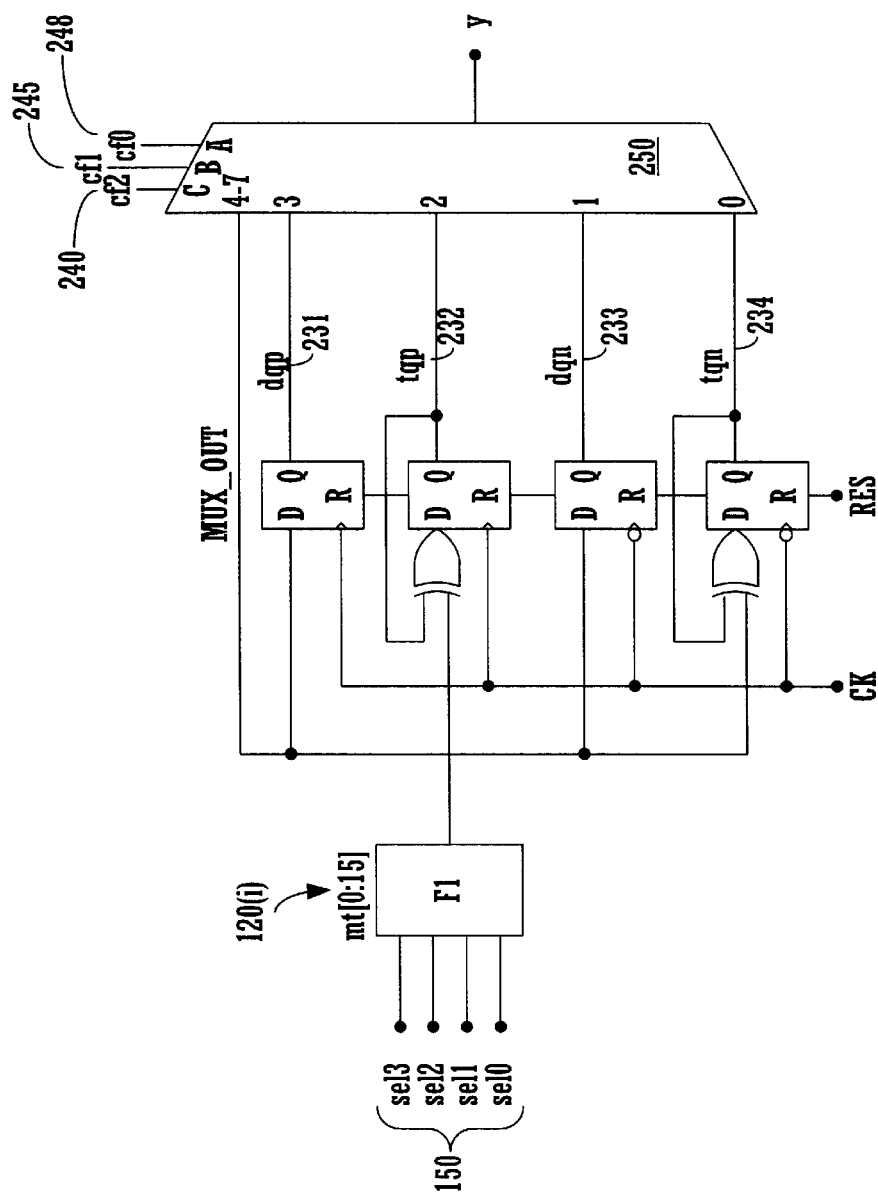
FIG. 5A illustrates the labels used for inputs and outputs for FIG. 2 logic block 200, when describing logic block 200 in the Verilog language.

To illustrate the synthesizable nature of the present invention, Figure SA and SB depict a microcell according to an embodiment of the present invention and its description in Verilog language. FIG. 5A corresponds to FIG. 1 and is shown in conjunction with FIG. 5B to demonstrate their correspondence.

FIG. 5A illustrates the labels used for inputs and outputs to logic block 200, when describing logic block 200 in the Verilog language. Select inputs 150 are labeled sel0, sel1, sel2, and sel3. Data input 120(I) is labeled mt[0:15], data inputs 240, 245, and 248 are labeled cf2, cf1, and cf0 respectively. Similarly, output from latches to multiplexer 250, numbered 231, 232, 233, and 234 are labeled 'dqp', 'tqp', 'dqn', and 'tqn' respectively, and the unregistered function generator output is labeled 'mux-out'.

FIG. 5B represents Verilog code for implementing the logic shown in FIG. 5A. Lines 1–6 establish the input and output signals. Line 3 shows the four output selector configuration bits 240, 245, 245 which are named 'cf[2:0]' Line 4 shows the sixteen minterm bits which are named 'mt [0–15]'.

Line 1 is where the module is named 'funcblock'. This module does not implement the logic to set the minterms and configuration bits, instead making them individual inputs to the module.

Line 7 creates the function generator multiplexer, which as previously shown, implements any logic function of four select inputs.

Lines 8–18 create the four latches whose outputs are the previously described "dqp' (as shown in line 11 of FIG. 5B), 'tqp' dqp' (as shown in line 12 of FIG. 5B), 'dqn' dqp' (as shown in line 16 of FIG. 5B), and 'tqn' dqp' (as shown in line 17 of FIG. 5B). Lines 19–28 create the output selector multiplexer 250. Line 29 terminates the 'funcblock' module.

It is appreciated that well known computer implemented logic synthesis tools can be used to synthesize the Verilog description of FIG. 5B into a standard library cell that can be integrated into various IC designs. The Verilog code shown herein can be ported to any chip design environment and a logic synthesizer will construct the modules entirely from standard gates. Therefore, the module can be built in any digital technology and can easily be included in standard design libraries.

FIG. 6 is an illustration of another embodiment of this invention describing the logic block 400 shown in FIG. 4 in Verilog language.

Four copies of the 'funcblock' module are instantiated in lines 117–122, lines 123–128, lines 129–134, and lines 135–140.

The majority of the 'wiring' to each module is accomplished by the pin assignment statements in each instantiation. For example, the function block 'fb1' in lines 117–122 uses the signals A,B,C,D as its 'sel' inputs, and the output pin is connected to the signal 'YQ[0]' in line 122.

The user customization of the present invention is accomplished by user-selection and loading configuration bits into the configuration data inputs. As an example of how the user-customizable configuration bits may be implemented, lines 105–114 construct a 78-bit shift register which contains the minterms and configuration bits for the entire module shown in FIG. 4. The bit assignment for the shift register 'K' outputs are arranged to correspond to the bit numbers shown in the shaded ovals in FIG. 4. For example, the minterms for the logic block 'fb1' are K0–K15 (as shown in line 120 of FIG. 6), and the three configuration bits are K64–K66 (as shown in line 119 of FIG. 6).

FIG. 7 is a flowchart of steps of process 700 for inserting an standard cell based on an HDL description of a programmable gate-only logic device into a larger integrated circuit design.

In step 710 of FIG. 7, the process 700 requires accessing an HDL description of a gate-only programmable circuit. The programmable circuit includes a first gate-only programmable block comprising: a first programmable function generator which comprises of a plurality of $2^n$ programmable bits; a first multiplexer receiving a plurality of n select lines and a plurality of $2^n$ data lines, the $2^n$ data lines respectively coupled to the plurality of $2^n$ programmable bits, the plurality of n select lines based on the plurality of $2^n$ programmable bits; and a second multiplexer for selecting between the output of the first multiplexer and a clocked output of the first multiplexer, the second multiplexer has select inputs which are programmable.

In step 720 of FIG. 7, the process 700 shows synthesizing the programmable block into a standard library cell.

In step 730 of FIG. 7, the process 700 explains integration of the standard library cell into an integrated circuit design.

In summary, the present invention provides a method for describing a user programmable logic device in Verilog, or any other HDL (e.g, VHDL). The logic function generator includes a plurality of select inputs and a plurality of configuration data inputs. The logic function generator receives user's input through the plurality of configuration bits associated with data inputs to generate an output of a desired logic function of select inputs. The logic function generator is entirely made of standard gates which is amenable to design libraries.

The foregoing descriptions of specific embodiments of the present invention have been presented for the purpose of illustration and description. They are not intended to be exhaustive or to limit the invention to the precise form disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications and suited to the particular use contemplated. It is intended that the scope of the invention be defined by the Claims appended hereto and their equivalents.

What is claimed is:

1. A memory stored Hardware Description Language (HDL) description of a circuit, said circuit comprising:
   a) a programmable circuit for implementing a function comprising:
      a1) a first multiplexer comprising:
         a plurality of select inputs;
         a plurality of first data inputs; and
         an output;
      a2) a plurality of programmable bits respectively coupled to each one of said plurality of first data inputs for implementing said function of said select inputs; and
   b) a second multiplexer comprising:
      b1) a plurality of inputs receiving said output of said first multiplexer and
         a plurality of second data inputs; and
      b2) a plurality of programmable bits coupled to each one of said plurality of second data inputs.

2. The memory stored Hardware Description Language description of a circuit of claim 1, wherein said first multiplexer is a 16:1 multiplexer.

3. The memory stored Hardware Description Language description of a circuit of claim 1, wherein said first multiplexer has four select inputs.

4. The memory stored Hardware Description Language description of a circuit of claim 1, wherein said first multiplexer has 16 data inputs.

5. The memory stored Hardware Description Language description of a circuit of claim 1, wherein said plurality of programmable bits are volatile latches functioning as a shift register.

6. The memory stored Hardware Description Language description of a circuit of claim 1, wherein said plurality of programmable bits are volatile latches functioning as a shift register with a scan input and an output, said output allowing said shift register being concatenated with other logic blocks.

7. The memory stored Hardware Description Language description of a circuit of claim 1, wherein said programmable bits are non-volatile cells.

8. The memory stored Hardware Description Language description of a circuit of claim 1, wherein said first multiplexer has n select inputs.

9. The memory stored Hardware Description Language description of a circuit of claim 8, wherein said first multiplexer generates said logic function having $2^n$ minterms.

10. An HDL description of a programmable circuit, said programmable circuit comprising a first programmable block comprising:
   a) a first programmable function generator comprising:
      a1) a plurality of $2^n$ programmable bits;
      a2) a first multiplexer receiving a plurality of n select lines and a plurality of $2^n$ data lines, said plurality of $2^n$ data lines respectively coupled to said plurality of $2^n$ programmable bits, said first multiplexer for generating, at an output, a function of said plurality of n select lines based on said plurality of $2^n$ programmable bits; and
   b) a second multiplexer for selecting between said output of said first multiplexer and a clocked output of said first multiplexer, said second multiplexer having a select input that is programmable.

11. An HDL description as described in claim 10 wherein said programmable block further comprises latch circuitry coupled to said output of said first multiplexer and coupled to supply a signal to said second multiplexer.

12. An HDL description as described in claim 11 wherein said latch circuitry comprises a positive edge triggered D flip-flop.

13. An HDL description as described in claim 11 wherein said latch circuitry comprises a negative edge triggered T flip-flop.

14. An HDL description as described in claim 10 wherein n=4.

15. An HDL description as described in claim 10 wherein said programmable bits comprise flip-flop circuits.

16. An HDL description as described in claim 10 wherein said flip-flop circuits are configured as a serial shift register with a scan input.

17. An HDL description as described in claim 10 wherein said programmable bits comprise non-volatile cells.

18. An HDL description as described in claim 10 wherein said programmable circuit further comprises a second programmable block cascaded with said first programmable block, said second programmable block implemented in accordance with said first programmable block.

19. A method comprising the steps of:
   a) accessing an HDL description of a programmable circuit, said programmable circuit comprising a first programmable block comprising:
      a first programmable function generator comprising:
         a plurality of $2^n$ programmable bits;
         a first multiplexer receiving a plurality of n select lines and a plurality of $2^n$ data lines, said plurality of $2^n$ data lines respectively coupled to said plurality of $2^n$ programmable bits, said first multiplexer for generating, at an output, a function of said plurality of n select lines based on said plurality of $2^n$ programmable bits; and
         a second multiplexer for selecting between said output of said first multiplexer and a clocked output of said first multiplexer, said second multiplexer having a select input that is programmable;

b) synthesizing said programmable block into a standard library cell; and c) integrating said standard library cell into an integrated circuit design.

20. A method as described in claim 19 wherein said programmable block further comprises latch circuitry coupled to said output of said first multiplexer and coupled to supply a signal to said second multiplexer.

21. A method as described in claim 20 wherein said latch circuitry comprises a positive edge triggered D flip-flop.

22. A method as described in claim 19 wherein n=4.

23. A method as described in claim 19 wherein said programmable bits comprise flip-flop circuits.

24. A method as described in claim 23 wherein said flip-flop circuits are configured as a serial shift register with a scan input.

25. A method as described in claim 19 wherein said programmable bits comprise non-volatile cells.

26. A method as described in claim 19 wherein said programmable circuit further comprises a second programmable block cascaded with said first programmable block, said second programmable block implemented in accordance with said first programmable block.

27. A memory stored verilog description of a circuit, said circuit comprising:

a) a programmable circuit for implementing a function comprising:

a1) a multiplexer comprising:

a plurality of select inputs;

a plurality of first data inputs; and an output;

a2) a plurality of programmable bits respectively coupled to each one of said plurality of first data inputs for implementing said function of said select inputs.

* * * * *